United States Patent [19]

Foroni et al.

[11] Patent Number: 4,631,561
[45] Date of Patent: Dec. 23, 1986

[54] SEMICONDUCTOR OVERVOLTAGE SUPPRESSOR WITH ACCURATELY DETERMINED STRIKING POTENTIAL

[75] Inventors: Mario Foroni, Verona; Franco Bertotti, Milan, both of Italy

[73] Assignee: SGS-ATES Componenti Elettronici SpA, Milano, Italy

[21] Appl. No.: 633,434

[22] Filed: Jul. 23, 1984

[30] Foreign Application Priority Data

Jul. 29, 1983 [IT] Italy ............................ 22338 A/83

[51] Int. Cl.⁴ .................................... H01L 29/90
[52] U.S. Cl. ........................... 357/13; 357/38; 357/51; 357/86; 357/91; 361/56; 361/91
[58] Field of Search ............... 357/13, 38, 51, 86, 357/91; 361/56, 91

[56] References Cited

U.S. PATENT DOCUMENTS

| | | | |
|---|---|---|---|
| 3,146,135 | 8/1964 | Sah | 357/38 |
| 3,236,698 | 2/1966 | Shockley | 357/38 |
| 3,651,564 | 3/1972 | Glass | 357/38 |
| 3,739,236 | 6/1973 | Lord | 357/38 |
| 3,774,085 | 11/1973 | Platzoeder et al. | 357/38 |
| 3,958,268 | 5/1976 | Kamel et al. | 357/38 |
| 4,321,524 | 3/1982 | Petrovic | 361/91 |
| 4,511,913 | 4/1985 | Nagano | 357/38 |

OTHER PUBLICATIONS

D. Goldthorp et al. "An Int. Ckt. Composite PNPN Diode," 1979 IEDM, Wash. D.C., Conf. Proc. pp. 180–183.

Primary Examiner—Joseph E. Clawson, Jr.
Attorney, Agent, or Firm—Wenderoth, Lind & Ponack

[57] ABSTRACT

A semiconductor suppressor device consists of a structure including a P-type substrate, an N-type epitaxial layer, a first P-type diffusion region in the epitaxial layer, and a second N-type diffusion region in the first region. A first metallic layer which is in contact with the substrate and a second metallic region which is in contact with the first and the second regions form the terminals of the device. The epitaxial layer has at least one zone along the junction with the first region which has a higher concentration than the rest of the layer so that the conduction through a reverse-biased junction occurs in this zone. This enables the establishment of a highly accurate striking potential for the suppressor device.

1 Claim, 3 Drawing Figures

SEMICONDUCTOR OVERVOLTAGE SUPPRESSOR WITH ACCURATELY DETERMINED STRIKING POTENTIAL

BACKGROUND OF THE INVENTION

The present invention relates to semiconductor devices and, more particularly, to a two-terminal device with a three-junction structure having the function of an overvoltage suppressor.

Overvoltage suppressors are circuit components that are especially employed when it is desired to avoid damage to a circuit that can be subjected to high overvoltages, either transient or continuous. Ideally, this circuit behaves like an open circuit under normal operating conditions, and like a short circuit when the voltage applied to its terminals exceeds a predetermined value (i.e.—a striking potential).

A three-junction device of known construction is shown in cross-section in FIG. 1. The device is formed on a P-type monocrystalline silicon substrate denoted by 1 on which an epitaxial layer 2 of silicon doped with N-type impurities has been allowed to grow and in which there has been formed, through diffusion operations with conventional processes known from planar technology, a circular region with a P-type conductivity indicated by 3 in the figure.

Within the region 3 of the structure depicted in FIG. 1 there is then formed, by diffusion with N-type impurities, a likewise circular region denoted by 4 in order to obtain a PNPN structure. A metallic layer 5, in ohmic contact with the surface portions of the regions 3 and 4, forms the emitter terminal of the device, and a metallic layer 6 in ohmic contact with the substrate 1 forms the collector terminal. The surface of the device, except for the zones of the metallic contacts, is covered with a silicon dioxide layer 7.

The operation of the device whose structure is shown in FIG. 1 can readily be understood by examining the equivalent electrical circuit shown in FIG. 3 where the emitter 10 of an NPN transistor TR2 corresponds to the region 4 of the structure; the base 11 of the transistor TR2 and the collector 15 of a PNP transistor TR1 correspond to the region 3 of the structure; the resistor R between the base 11 and the emitter 10 of the transistor TR2 represents the resistance distributed between the junction defined by the regions 3 and 4 and the emitter contact 5; the collector 12 of the transistor TR2 and the base 14 of the transistor TR1 correspond to the region 2 of the structure, and the emitter 13 of the transistor TR1 corresponds to the region 1 of the structure.

If one applies a voltage between the two electrodes 5 and 6 of the structure described above, that is—a positive voltage +V on the terminal 6, across the junction between the region 2 and the region 3 indicated by 8 an electrical field E will be established which causes the depletion of majority carriers in the region adjoining the junction (i.e.—a depletion layer) and which further causes the consequent creation of a space charge near the junction proper. If the voltage +V has a value such that the electrical field E exceeds a critical value determined by the physical and geometrical characteristics of the regions forming the junction, there occurs within the depletion region a chain reaction called an avalanche breakdown which is the cause of a sudden flow of current through the junction. To represent said effect operationally, a Zener diode $D_z$ is shown in FIG. 3 between the base 11 of the transistor TR2 (region 3 of the structure) and the collector 12 of the transistor TR2, (region 2 of the structure).

Under these conditions, current flows between the two electrodes 5 and 6 of the device, because both transistors TR1 and TR2 are conducting. It is known that the avalanche breakdown in a planar junction protected on the surface by an insulating layer of silicon dioxide, such as the layer 7 depicted in FIG. 1, occurs on the surface due to the presence of disturbing carriers in the insulating layer. They have the effect of limiting the depletion layer to the surface thereof and thus have the effect of reducing the breakdown voltage, or the breakdown of the junction. It is also known that the repetition of such a phenomenon tends to alter the characteristics of the reverse-biased junction and to modify its breakdown voltage.

To make the above-mentioned phenomenon less sensitive, in the structure of FIG. 1, the metallic layer 5 in ohmic contact with the surface portions of the regions 3 and 4 can be extended to above the insulating layer 7 until it rises above part of the region 2. In practice, this metallic layer so extended, which used to be called a field plate when the voltage applied between the electrodes 5 and 6 has the polarity indicated in the electrical circuit of FIG. 3, serves to remove possible accumulations of carriers from the surface of the oxide 7 and allows the surface of the oxide 7 and the underlying doped silicon surface to be at an equipotential level, so that the breakdown no longer occurs on the surface, but inside the junction 8 and at a higher voltage. Specifically, unless phenomena of a different nature occur, this takes place on the surface of maximum curvature of the junction and at a voltage which remains stable throughout the life of the device. However, such a voltage cannot be accurately defined in the design phase due to the changeability of the fabrication parameters.

It is also known that in order to bring about the conduction between the regions 1 and 3 of a structure of the type illustrated in FIG. 1, as is necessary for the firing of the conduction between the two electrodes 5 and 6 of the device, one can act upon the fabrication parameters, particularly on the resistivity and on the thickness of the epitaxial layer 2, so that the conduction through the junction 8 due to an avalanche breakdown cannot be initiated, because it is anticipated by another phenomenon which modifies the operating conditions of the structure. Said phenomenon, known as punch-through, occurs when the depletion zone of the junction formed between the regions 1 and 2 extends throughout the epitaxial layer delimited by the region 3 in order to cause a short circuit between the regions 1 and 3. However, even in this case, it is not possible to accurately define the striking potential in the design phase due to the changeability of the fabrication parameters.

SUMMARY OF THE INVENTION

The object of the present invention is to provide a semiconductor device that has two terminals, and is capable of functioning as an overvoltage suppressor, and has a striking potential that is accurately defined in the design phase.

According to the invention, this object is achieved by the device defined and characterized in the appended claims.

The above-noted object may be effected by providing a two-terminal semiconductor device with a three-junction structure which is formed on a semiconductor chip and which comprises:

a substrate of a first type of conductivity delimited by a first main surface of said semiconductor chip; a layer of a second type of conductivity disposed on said substrate and delimited by a second main surface of said semiconductor chip; a layer of insulating material which extends onto said second main surface; a first region of said first type of conductivity that extends into said layer of said second type of conductivity from said second main surface; a second region of said second type of conductivity which extends into said first region from said second main surface; a first metallic layer which is in ohmic contact with said substrate on said first main surface thereof; and a second metallic layer which extends onto a portion of said second main surface through an aperture in said insulating layer so as to be in ohmic contact with said first and second regions, and which is on said insulating layer so as to rise above a portion of said layer of said second type of conductivity along a contour of said first region; wherein said layer of said second type of conductivity has at least one zone which is adjacent to said first region, said zone having a concentration of impurities that is greater than that of the rest of said layer, and said zone being localized in a portion of a boundary with said first region which is not opposite to said second region.

The above-noted object may be further effected by providing a process for the fabrication of a semiconductor device with a three-junction structure which is formed on a semiconductor chip and which comprises: a substrate of a first type of conductivity delimited by a first main surface of said semiconductor chip; a layer of a second type of conductivity disposed on said substrate and delimited by a second main surface of said semiconductor chip; a layer of insulating material which extends onto said second main surface; a first region of said first type of conductivity that extends into said layer of said second type of conductivity from said second main surface; a second region of said second type of conductivity which extends into said first region from said second main surface; a first metallic layer which is in ohmic contact with said substrate on said first main surface thereof; and a second metallic layer which extends onto a portion of said second main surface through an aperture in said insulating layer so as to be in ohmic contact with said first and second regions, and which is on said insulating layer so as to rise above a portion of said layer of said second type of conductivity along a contour of said first region; wherein said layer of said second type of conductivity has at least one zone which is adjacent to said first region, said zone having a concentration of impurities that is greater than that of the rest of said layer, and said zone being localized in a portion of a boundary with said first region which is not opposite to said second region; wherein said layer of said second type of conductivity is epitaxially grown on said substrate and wherein said first and second regions are formed by diffusion processes; wherein, prior to the diffusion of said first region, impurities of said second type of conductivity are ion implanted into a portion of said second main surface through which said subsequent diffusion of said first region but not said second region occurs, the parameters of said process being chosen in such a way that said implanted region is deeper than said first diffused region and preserves said second type of conductivity solely outside of said first region.

BRIEF DESCRIPTION OF THE DRAWINGS

The invention will be better understood from a consideration of the ensuing detailed description of one of its embodiments given solely by way of illustrative non-limitative example with reference to the accompanying drawings, in which.

DESCRIPTION OF THE PREFERRED EMBODIMENT

Figure 2:
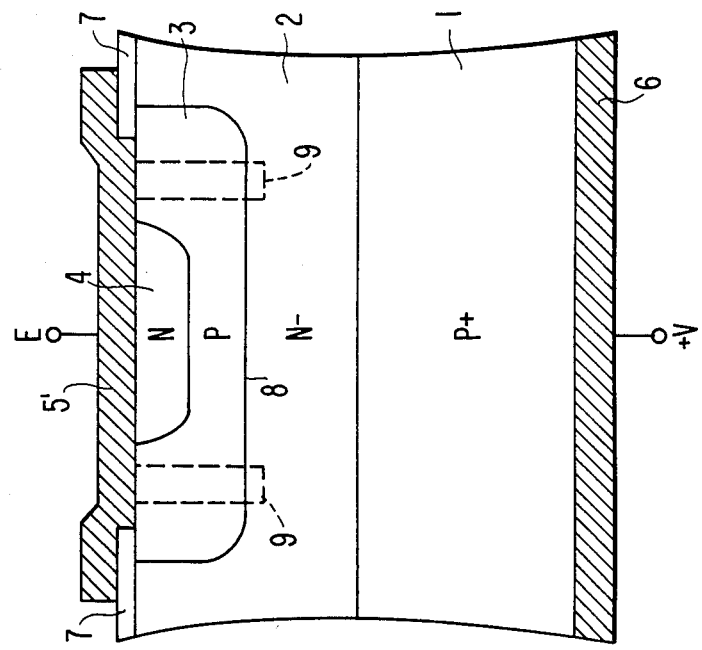
FIG. 2 is an enlarged cross-sectional view of a two-terminal device with a three-junction structure incorporating the present invention.
Figure 1:
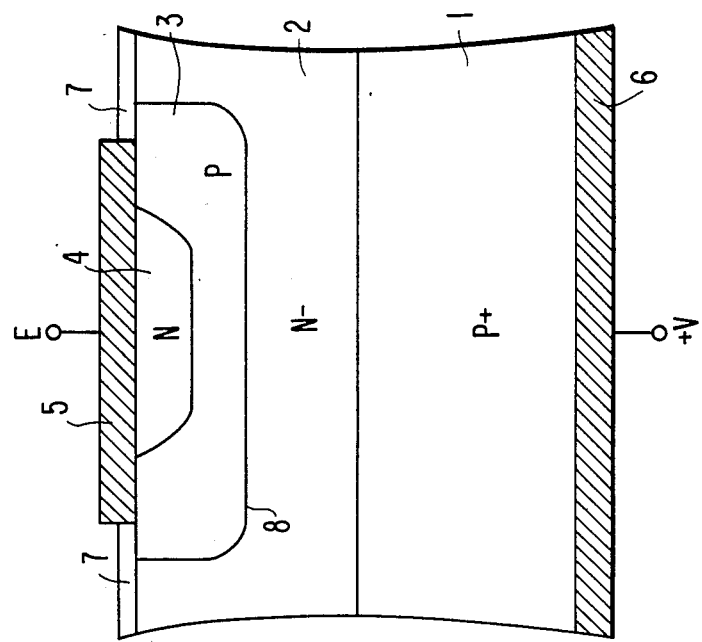
FIG. 1, described above, represents an enlarged cross-sectional view of a prior art two-terminal device with a known three-junction structure.

Now, referring to FIG. 2 in which parts similar to those of FIG. 1 are denoted by the same reference numerals, it will be noted that the emitter electrode, denoted by 5', has been extended to above a portion of the region 2 so as to obtain a field plate of the type described above but not shown, in relation to FIG. 1. Furthermore, before diffusing the region 3 with P-type impurities, N-type impurities, e.g., phosphorus, are implanted into an area having the form of a circular crown so as to obtain a localized enrichment of the N-type region. The concentration of P-type impurities in the subsequent formation of the region 3 is very high, so that the type of conductivity of the implanted zone that lies within the diffused region 3 is reversed.

The design parameters are chosen in such a way that a zone N indicated by 9 in FIG. 2 remains and which has a higher conductivity than that of the region 2 which extends slightly into said last region. In particular, the quantity and energy of implantation are calculated in such a way that the breakdown of the junction 8 occurs in the zone 9 at a voltage which is lower than that which would occur in case of a breakdown through the curvature effect, but which can be defined accurately in the design phase.

It should be noted that the enriched zone 9 lies in the part of the junction 8 that is lateral with respect to the emitter region 4, that is to say, outside of the principal flow of current through the device.

Figure 3:
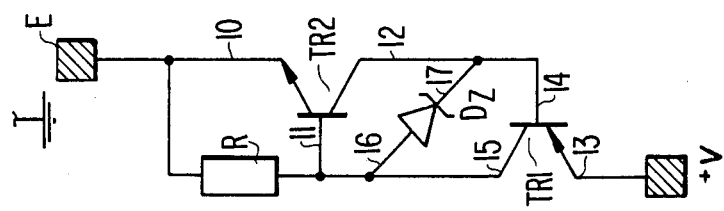
FIG. 3 is the equivalent circuit of the device, either known from the prior art or according to the present invention, under particular biasing conditions.

The operation of the device, whose structure described above embodies the invention, can be represented by the electrical circuit of FIG. 3 where the Zener diode $D_z$ still corresponds to the region 3 with regard to its anode 16, but corresponds to the enriched zone 9 as far as its cathode 17 is concerned.

While one embodiment of the invention has been illustrated and described, it is obvious that numerous variations and modifications are possible without deviating from the scope of the invention. For example, the enriched zone 9 can have a form and dimensions that are different from those illustrated in FIG. 2 and can also be formed by a multiplicity of zones that are separated from one another.

What is claimed is:

1. A two-terminal semiconductor device with a three-junction structure which is formed on a semiconductor chip and which comprises:

a substrate of a first type of conductivity delimited by a first main surface of said semiconductor chip;

a layer of a second type of conductivity disposed on said substrate and delimited by a second main surface of said semiconductor chip;

a layer of insulating material which extends onto said second main surface;

a first region of said first type of conductivity that extends into said layers of said second type of conductivity from said second main surface;

a second region of said second type of conductivity which extends into said first region from said second main surface;

a first metallic layer which is in ohmic contact with said substrate on said first main surface thereof; and a second metallic layer which extends onto a portion of said second main surface through an aperture in said insulating layer so as to be in ohmic contact with said first and second regions, and which is on said insulating layer so as to rise above a portion of said layer of said second type of conductivity along a contour of said first region;

wherein said layer of said second type of conductivity has at least one zone which is adjacent to a boundary plane portion of a junction formed between said first region and said layer of said second type of conductivity, said zone having a concentration of impurities that is greater than that of the rest of said layer, and said zone being localized in a portion of said boundary with said first region which does not contact said second region.

* * * * *